(12) United States Patent
Mellick et al.

(10) Patent No.: US 7,894,204 B1
(45) Date of Patent: Feb. 22, 2011

(54) MATRIX BOARD ASSEMBLY

(75) Inventors: Dave A. Mellick, Rathdrum, ID (US); Jerry L. Stevenson, Rathdrum, ID (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 264 days.

(21) Appl. No.: 12/353,341

(22) Filed: Jan. 14, 2009

Related U.S. Application Data

(60) Provisional application No. 61/191,529, filed on Sep. 2, 2008.

(51) Int. Cl.
*H05K 1/18* (2006.01)
(52) U.S. Cl. ....................................................... 361/778
(58) Field of Classification Search ......... 361/785–791, 361/772, 773, 774, 776, 777, 778, 803; 257/700
See application file for complete search history.

(56) References Cited

U.S. PATENT DOCUMENTS

| | | | | | |
|---|---|---|---|---|---|
| 3,739,231 | A | * | 6/1973 | Luteran | 361/805 |
| 4,522,449 | A | * | 6/1985 | Hayward | 361/775 |
| 6,384,341 | B1 | * | 5/2002 | Rothermel et al. | 174/255 |
| 7,057,115 | B2 | * | 6/2006 | Clink et al. | 174/255 |
| 7,081,591 | B2 | * | 7/2006 | Swetland | 174/254 |

* cited by examiner

*Primary Examiner*—T C Patel
*Assistant Examiner*—Sherman Ng
(74) *Attorney, Agent, or Firm*—Richard A. Morgan

(57) ABSTRACT

An assembly of connected circuit boards includes at least one each of a matrix board, an input board and an output board. There are two types of input board, one for hydrophone cable input and one for single-ended (SE) cable input. The matrix board provides for switching any pair of input differential signals to any channel on the output board.

20 Claims, 6 Drawing Sheets

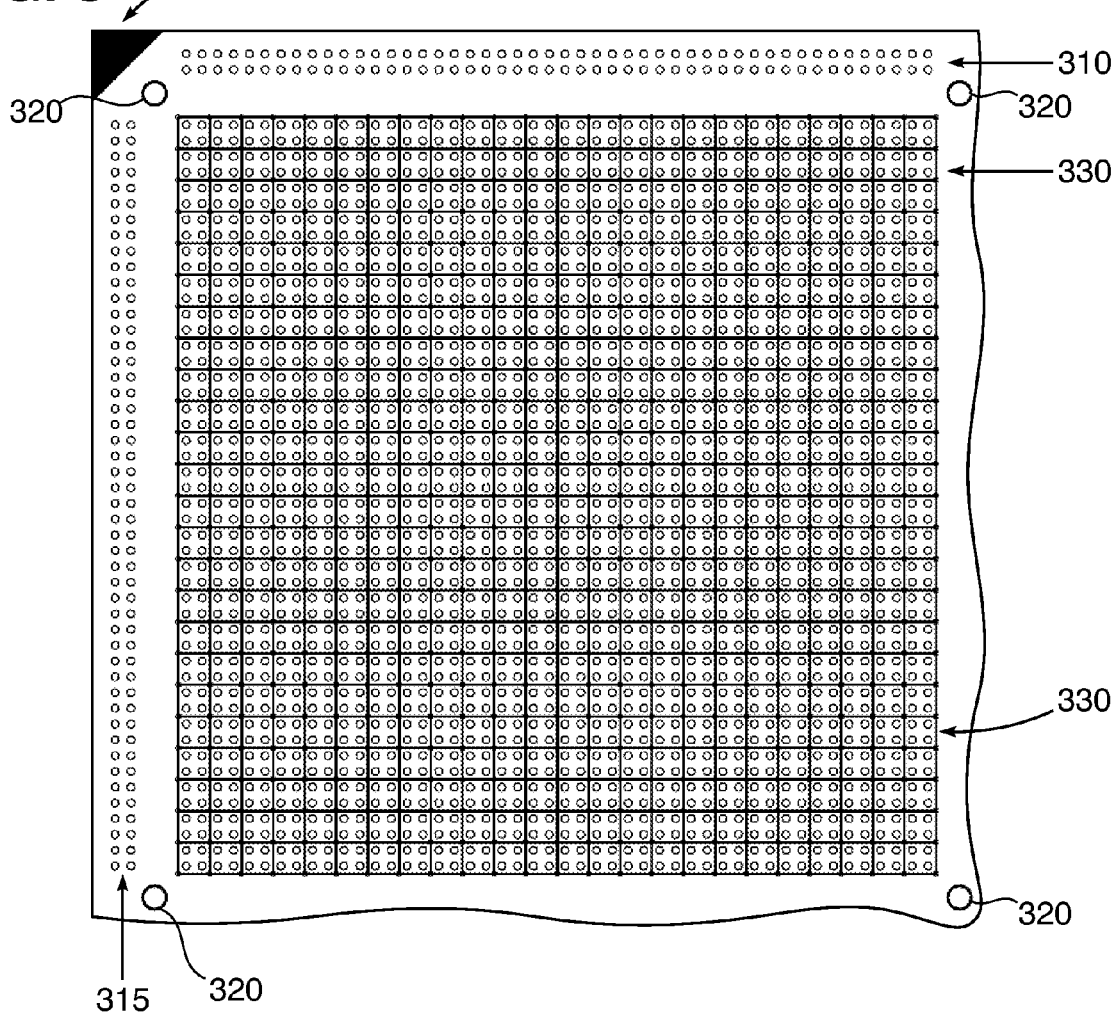
FIG. 3
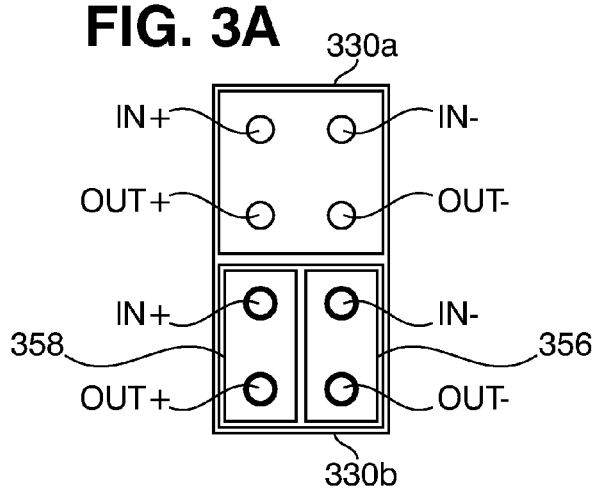
FIG. 3A
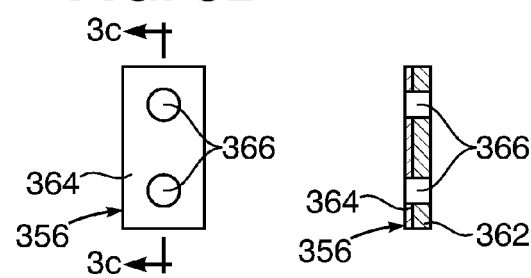
FIG. 3B
FIG. 3C

MATRIX BOARD ASSEMBLY

CROSS-REFERENCE TO RELATED APPLICATION

This application claims priority from U.S. Provisional Patent Application No. 61/191,529 filed Sep. 2, 2008, for a Hydrophone Signal Junction Board, the disclosure of which is incorporated herein by reference in its entirety.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

The invention relates to electrical systems and devices. More particularly, the invention relates to a matrix board with a panel having a planar surface for supporting a first circuit and a parallel surface for supporting a second circuit and pins for making connections between circuits. Most particularly the invention relates to an assembly of matrix board modules and I/O board modules adapted for connection of a hydrophone cable and an accelerometer cable.

2. Discussion of the Related Art

In an acoustic test facility, analog sensor signals are routed to data acquisition channels for analysis. Although data acquisition is conceptually simple, test facilities may have a large number of sensors and a large number of acquisition channels to connect. Connecting specific sensors to specific acquisition channels and checking all newly made circuits takes considerable effort. A change in test series requires reconfiguring the sensors and data acquisition channels and introduces the potential for error due to misrouting.

A cable patch panel is the primary apparatus used for reconfigurable test systems. A cable patch panel provides for routing all sensor cable to an input junction box panel and all data acquisition cables to an output junction box panel. Jumper cables make the connection to patch signals between the input junction box panel and the output junction box panel. This allows any sensor to be routed to any data acquisition channel by way of the jumper cables. While this apparatus is adequate when there are only a few sensors and channels, when the number of sensors and channels becomes large, the system becomes cumbersome. For example, in order to reroute a single connection, it may be necessary to disconnect a number of jumpers to access a desired cable. This introduces the potential for introducing errors when reattaching jumper cables. In addition, the size and weight of a large patch panel can make a system impractical for tests involving large numbers of sensors and channels.

Mechanical relay matrix boards are also used for signal routing. Relay boards connect an input to an output through a relay. However relays have limitations. Commercially available relay matrix boards have a limited number of channels. Typically, relays used for this purpose provide for 24 inputs and 24 outputs. Multiple relays can be used, but this increases cost and degrades signal quality.

Integrated circuits with solid state relays are also used for switching signals. Solid state relays are more compact than mechanical relays. However, solid state relays are active electronic devices that introduce small loads in signal lines. The sum of small loads becomes significant in large channel systems resulting in amounts of signal distortion and loss. Amplifiers have been added to solid state matrix boards to make up these losses. However, this introduces signal directionality problems. In addition, most solid state relays are able to pass only low differential signals. They cannot be used for ICP(IEPE-type) device signals, i.e. signals from Integrated Circuit Piezoelectric (Integrated Electronics Piezo Electric) devices. ICP(IEPE-type) devices have transducers to measure parameters such as dynamic pressure, force strain and acceleration. ICP(IEPE-type) devices include hydrophones and accelerometers.

There is a need in the art for improvements in junction boards to accommodate hydrophone and accelerometers cables.

SUMMARY OF THE INVENTION

An assembly of connected circuit boards includes at least one each of a matrix board, an input board and an output board.

(a.) The matrix board comprises:
(i.) a pin connection panel, and
(ii.) superposed circuit support layers including at least one input circuit support layer and at least one output circuit support layer. Each circuit support layer has circuit lines on one face thereof. Multiple conductive pins are attached to each circuit line. The conductive pins extend to the pin connection panel and are arranged in a patterned array. In the patterned array, a pin associated with each input circuit is paired with and directly adjacent a pin associated with each output circuit. A jumper connection can be made between the paired pins so that any input circuit is connectable to any output circuit.

(b.) the input board includes at least one differential signal sensor cable connector.

The differential signal sensor cable connector has pin contacts including differential signal pin contacts corresponding with differential signal carrying lines in the differential signal sensor cable. A connector makes contact between each differential signal pin contact and a circuit line on the input circuit support layer.

(c.) The output board includes a connector having pin contacts for connection with circuit lines on the output circuit support layer on the matrix board.

The matrix board, input board and output board are each modular and can be assembled with the addition of like modules to accommodate large numbers of sensors and channels.

BRIEF DESCRIPTION OF THE DRAWING

FIG. 3 is a plan view of a portion of a matrix board. FIG. 3A is a plan view of two channel blocks shown in FIG. 3. FIG. 3B is a top plan view of a jumper used in FIG. 3A.

FIG. 3C is a sectional view of the jumper of FIG. 3B taken along the line 3C-3C of FIG. 3B.

DETAILED DESCRIPTION OF THE INVENTION

Figure 1:
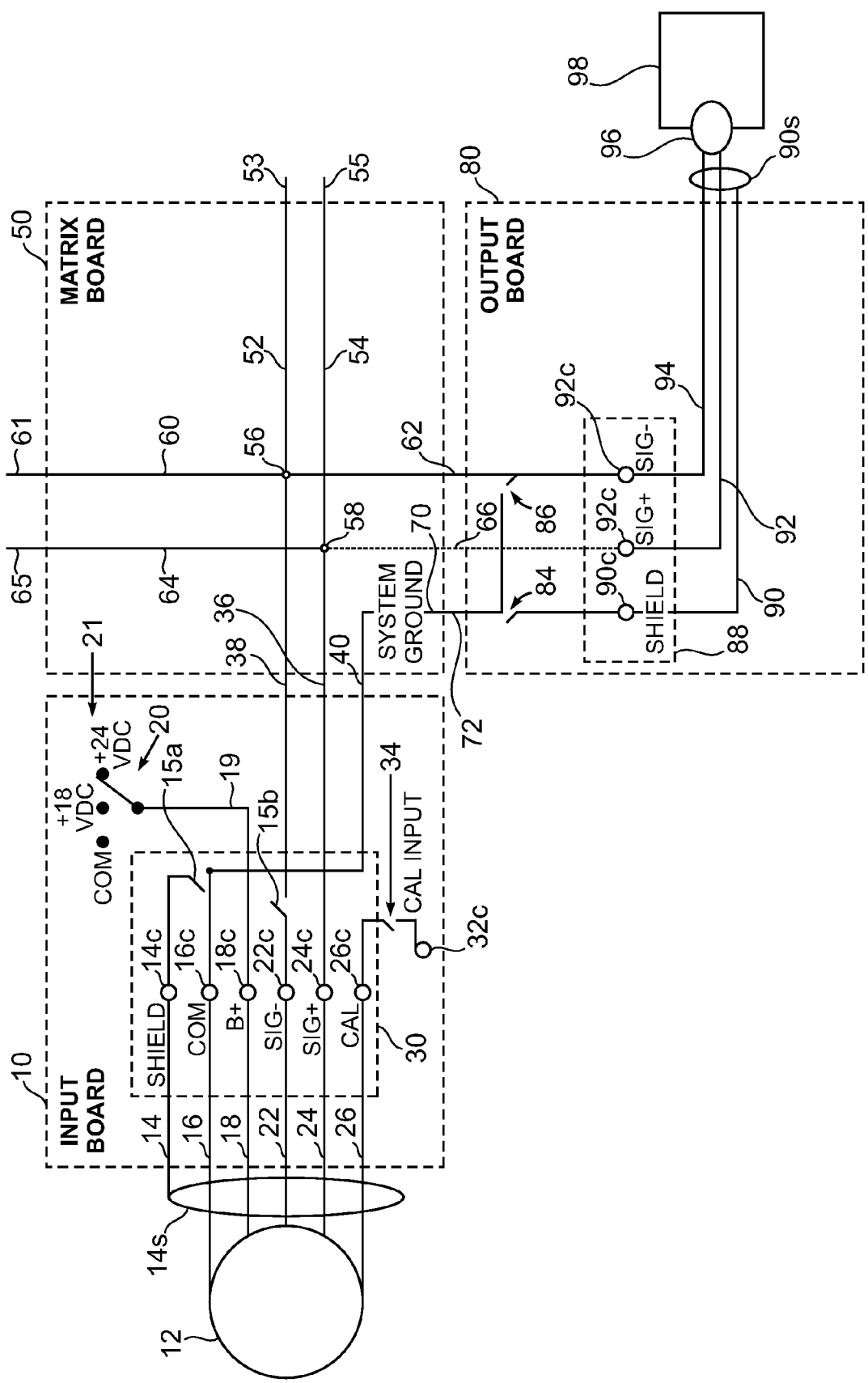
FIG. 1 is a schematic diagram of a hydrophone input board, a matrix board and an output board.

The assembly of printed circuit boards is configured to allow connection of a large number of analog sensors to data acquisition channels. Both high and low differential signal sensors are accommodated. The assembly can be laid out to allow easy reconfiguration and checking of the signal path where there are a large number of input signals and a large number of signal destinations.

The matrix board comprises a plurality of superposed circuit support layers. There is at least one input circuit support layer and at least one output circuit support layer. Each circuit support layer has circuit lines on one face. These circuit lines can be etched, printed or may be wires or equivalents known in the art for carrying an electronic signal. The circuit support layers are held in superposed relation so that all parts on the layers in the plurality are geometrically aligned and spaced. The generally straight circuit lines on the input circuit support layer are perpendicular, i.e. orthogonal, to the functionally straight circuit lines on the output circuit support layer. Multiple conductive pins are attached to each circuit line. Each pin extends to a superposed panel to permit connective access to the pin end. Each pin is insulated from all circuit lines other than the circuit line to which it is attached. The pins are laid out in an orderly array so that the pin end can be attached with a jumper to another pin end. The jumper carries the signal from the pin and attached circuit line to another pin and attached circuit line. As a result, signals are selectively conducted from circuit lines on the input conductive layer to circuit lines on the output conductive layer.

The arrangement of the input board, matrix board and output board allows any input signal or pair of differential input signals to be quickly associated with any output conductor or multiple output conductors. The assembly is initially arranged by: (i.) connecting the input signal to an input board pin contact, (ii.) connecting the input board pin contact with a pin attached to a circuit line on the input circuit support layer, (iii.) connecting a pin associated with the circuit line on the input circuit support layer with a pin associated with a circuit line on the output circuit support layer, (iv.) connecting a pin associated with the output circuit line with a pin on the output board and (v.) connecting a pin on the output board to the desired channel. Connections are made with jumpers.

After the initial connections are established, reconfiguring the input signals with different output channels is accomplished by changing the jumper connectors on the matrix board panel. Pairs of differential input signals are realigned with pairs of jumpers. Multiple pins are provided for each circuit line. This allows all connections to be made with short, easy to manipulate jumpers. Typically the center-to-center distance between paired pins on the pin connection panel is about 0.1 inch.

The utility of the assembly of circuit boards is most apparent where there are a large numbers of sensor input signals and large numbers of output channel destinations. Large numbers of circuits are accommodated by making the matrix board panels modular. A single matrix board panel can accommodate 48 input signal pairs and 48 output signal pairs. However, multiple matrix board modules can be connected together. An array of 240 input signal pairs and 48 output signal pairs is contemplated. An array of 144 input signal pairs and 144 output signal pairs is contemplated. Any combination based on multiples of 48 pairs of conductive lines per circuit board is possible.

Another advantage of the invention is the input and output (I/O) boards. The input board is in signal communication with a circuit line on an input circuit support layer and the output board is in signal communication with a circuit line on the output circuit support layer. There are two distinct types of input boards for accommodating high and low differential signal cables.

A hydrophone cable is a high differential signal cable. Hydrophone cable input boards have six wire connections per channel. Three of the connections support the signal from the sensor. These are the higher and lower differential signal wires and the shield. The other three wires support the sensor with a calibration signal, electric power and ground. The hydrophone input board connects with each of the six wires. The higher and lower differential signals are carried through the matrix board to the output board. The ground wire is connected to a common ground on a dedicated circuit support layer on the matrix board and the output board. The lower differential signal may optionally be connected to ground at the output board. The hydrophone is powered at the input board by connection to a power supply. A switch is provided for connection to a +24 vdc (direct current volts) source, a +18 vdc (direct current volts) source or to ground (Com). A calibration signal is also provided to the hydrophone by connection at the input board to a calibration signal generator. The hydrophone cable ground is grounded at the input board. Connections are made with jumpers. Likewise, switching is accomplished with jumpers.

A single-ended (SE) cable is a low differential signal cable. Single-ended (SE) cable input boards have three connections per channel. These connections are for the higher and lower differential signals and the shield. The higher and lower differential signals are carried through the matrix board to the output board. The lower differential signal may optionally be connected to ground at the input board or at the output board.

The invention is described with reference to the drawing. The drawing discloses a preferred embodiment of the invention and is not intended to limit the generally broad scope of the invention as set forth in the claims. The drawing is schematic and is not drawn to scale.

In FIG. 1, the assembly of connected circuit boards includes at least one each of an input board 10, a matrix board 50, and an output board 80. The circuit boards are modular so that they can be combined by mounting on a rack (not shown) and circuit lines can be joined to convey signals with continuity connectors to form an assembly containing an array of many inter-communicating circuit boards.

The assembly of modular circuit boards functions to allow assembly of a large number of sensors and a large number of data acquisition channels and to facilitate the time efficient and accurate rerouting of analog signals from the sensors to the channels.

Matrix board 50 comprises a superposed, planar input circuit support layer and output circuit support layer with circuits comprising multiple circuit lines on the respective faces. Input circuit lines 52 and 54 are a pair of conductive lines or the equivalent on the input circuit layer. In fact, the pair of circuit lines 52 and 54 is indicative of multiple lines, typically 24 to 96 pairs of circuit lines on the planar face of the circuit support layer. Circuit lines 60 and 64 on the output circuit support layer are equal in number and orthogonal to those on the input circuit support layer. The two sets of orthogonal planar conductive lines are electrically connected with jumper 56 and jumper 58. Jumper 56 connects a pin attached to circuit line 52 with a pin attached to circuit line 60. Jumper 58 connects a pin attached to circuit line 54 with a pin attached to circuit line 64. A signal in circuit line 52 is carried by this jumper 56 connection to circuit line 60. Likewise, a signal in circuit line 54 is carried by this jumper 58 connection to circuit line 64.

Continuity connectors 53 and 55 provide connection with circuit lines 52 and 54 and with corresponding circuit lines on any adjoining board (not shown). Likewise, continuity connectors 61 and 65 provide connection with circuit lines 60 and 64 and with corresponding circuit lines on any adjoining board (not shown).

A hydrophone sensor produces a high differential signal. Hydrophone sensor cable 12 includes within shield 14$s$ a shield wire 14 attached to shield pin contact 14$c$, common ground wire 16 attached to ground pin contact 16$c$, power wire 18 attached to power pin contact 18$c$, higher differential signal wire 24 attached to higher differential signal pin contact 24$c$, lower differential signal wire 22 attached to lower differential signal pin contact 22$c$ and calibration signal wire 26 attached to calibration signal pin contact 26$c$. Pin contacts 14$c$, 16$c$, 18$c$, 22$c$, 24$c$ and 26$c$ are attached to hydrophone sensor cable connector 30 on hydrophone input board 10.

Hydrophone cable 12 is joined to hydrophone sensor cable connector 30 by means of a standard hydrophone plug (not shown). Hydrophone cable 12 can be plugged into hydrophone sensor cable connector 30 and also unplugged. As shown in FIG. 3, there may be a multiple hydrophone cables with a hydrophone sensor cable connector each connected to an input board. Likewise, for each hydrophone cable there is a pair of differential signal wires.

Hydrophone input board 12 includes calibration input signal pin contact 32$c$ for connection to a calibration signal generator. Calibration signal generating means are shown by way of example in U.S. Pat. No. 4,689,578 for Hydrophone Preamplifier With Self Calibration by S. E. Spychalski and also in U.S. Pat. No. 5,477,504 for Balanced, Double-Sided Calibration Circuit for Sensor Element and Differential Preamplifier to J. D. Hagerty both incorporated herein by reference. Switch 34 completes the circuit between calibration input signal pin contact 32$c$ and calibration signal pin contact 26$c$.

Hydrophone input board 12 also includes electrical power selector switch 20 for connecting power pin contact 18$c$ with power supply 21 by way of circuit line 19. Power selector switch 20 provides three choices for connecting to power supply 21. Power supply 21 is a source of +24 vdc (direct current volts), +18 vdc (direct current volts) and ground (Com). The hydrophone (not shown) attached to hydrophone cable 12 is powered by way of power supply 21. The hydrophone receives a calibration signal by way of calibration input signal pin contact 32$c$. Both of these functions are provided through hydrophone input board 10.

Connector 36 connects higher differential signal pin contact 24$c$ with circuit line 54 on the input circuit layer of matrix board 50. Likewise, connector 38 connects lower differential signal pin contact 22$c$ with circuit line 52. Lower differential signal ground switch 15$b$ provides for grounding the lower differential signal. Connector 40 connects ground pin contact 16$c$ with common ground conductive line 70 on matrix board 50. Shield ground switch 15$a$ also allows shield pin contact 14$c$ to be connected to the common ground conductive wire 70. This connection is made if the hydrophone shield 14$s$ is not grounded at some other point. If the hydrophone shield 14$s$ is grounded somewhere else, shield ground switch 15 is left open to prevent possible current flow.

Connections between hydrophone sensor cable connector 30 and matrix board 50, calibration input signal means, power supply 21, and common ground 70 are usually provided on the back of the board with a terminal strip, such as a screw terminal strip to facilitate making electrical connection.

Output board 80 provides for the transfer of the pair of differential signals from matrix board 50, through single-ended cable connector 88, to single-ended (SE) output cable 96 and on to analog/digital converter 98. As seen in FIG. 1, connector 72 provides attachment of common ground 70 to output board 80. Switch 84 is provided to connect common ground 70 to shield pin contact 90$c$. Switch 86 is provided to connect common ground 70 to lower differential signal pin 94$c$. Single-ended (SE) output cable 96 includes a shield 90$s$ attached to shield pin contact 90$c$ by way of shield wire 90. Connector 66 provides connection between circuit line 64 and higher differential signal contact pin 92$c$. Connector 62 provides connection between circuit line 60 and lower differential signal contact pin 94$c$. Contact pins 90$c$, 92$c$ and 94$c$ are all included in single-ended cable connector 88. Shield wire 90, higher differential signal wire 92 and lower differential signal wire 94 form single-ended (SE) output cable 96.

FIG. 1 shows that higher and lower differential signals from hydrophone sensor cable 12 are transferred through matrix board 50 to single-ended (SE) cable 96 and on to analog/digital converter 98. It is clear from FIG. 1 and FIG. 3 that multiple hydrophone cables can be assembled and connected to matrix board 50, allowing for switching of individual hydrophone signals to selected channels.

Figure 2:
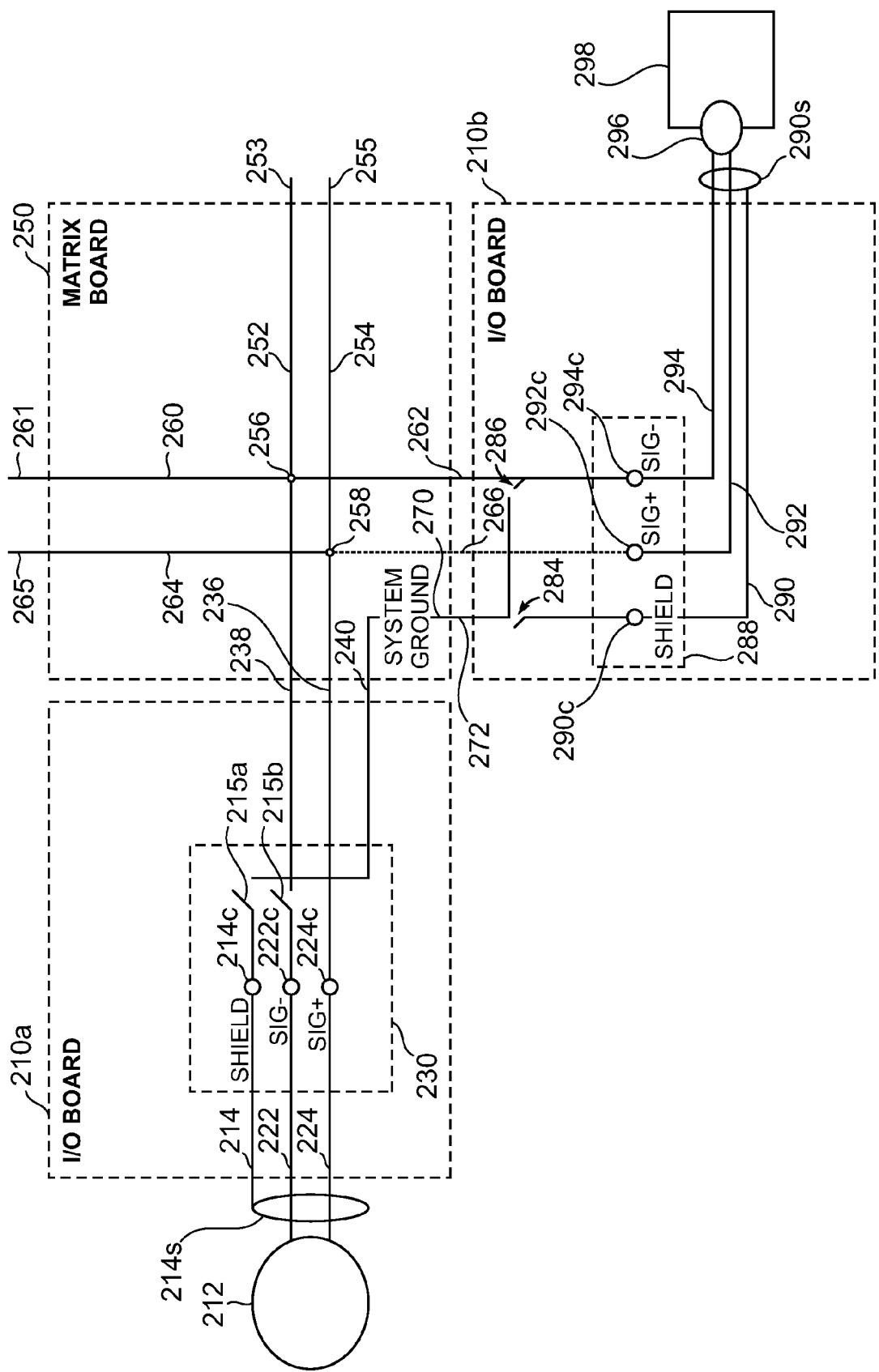
FIG. 2 is a schematic diagram of an accelerometer input board, a matrix board and an output board.

In FIG. 2, the assembly of connected circuit boards includes at least one each of an input board 210$a$, a matrix board 250, and an output board 210$b$. In this embodiment, input board 210$a$ and output board 210$b$ are physically joined to form a single input/output (I/O) board. The circuit boards are modular so that they can be combined by mounting in a rack (not shown) and circuit lines joined to convey signals with continuity connectors 253, 255, 261 and 265 to form an assembly containing an array of many inter-communicating circuit boards.

Matrix board 250 comprises a superposed, planar input circuit support layer and output circuit support layer with circuit lines on the respective faces. Input matrix board circuit lines 252 and 254 are a pair of circuit lines or the equivalent on the input circuit support layer. In fact, the pair of circuit lines 252 and 254 is indicative of multiple lines, typically 24 to 96 pairs of circuit lines on the planar face of the circuit support layers. Circuit lines 260 and 264 on the output matrix board are equal in number and orthogonal to those on the input matrix board. Jumper 256 and jumper 258 are indicative of a pair of electrical connectors that join a circuit line on the input circuit support layer with circuit line on the output circuit support layer. Jumper 256 is positioned to join a pin attached to circuit line 252 with a pin attached to circuit line 260. A signal in circuit line 252 is carried by jumper 256 to circuit line 260. Jumper 258 is positioned to join a pin attached to circuit line 254 with a pin attached to circuit line 264. A signal in circuit line 254 is carried by jumper 258 to circuit line 264.

Continuity connectors 253 and 255 provide connection with circuit lines 252 and 254 and with corresponding circuit lines on any adjoining board (not shown). Likewise, continuity connectors 261 and 265 provide connection with circuit lines 260 and 264 and with corresponding circuit lines on any adjoining board (not shown).

Accelerometer sensor cable 212 is a single-ended (SE) signaling cable that includes within shield 214$s$, a shield wire 214 attached to shield pin contact 214$c$, higher differential signal wire 224 attached to higher differential signal pin contact 224$c$, and lower differential signal wire 222 attached to lower differential signal pin contact 222$c$. Pin contacts 214$c$, 222$c$ and 224$c$ are attached to differential cable connector 230 on input board 210$a$.

Figure 4:
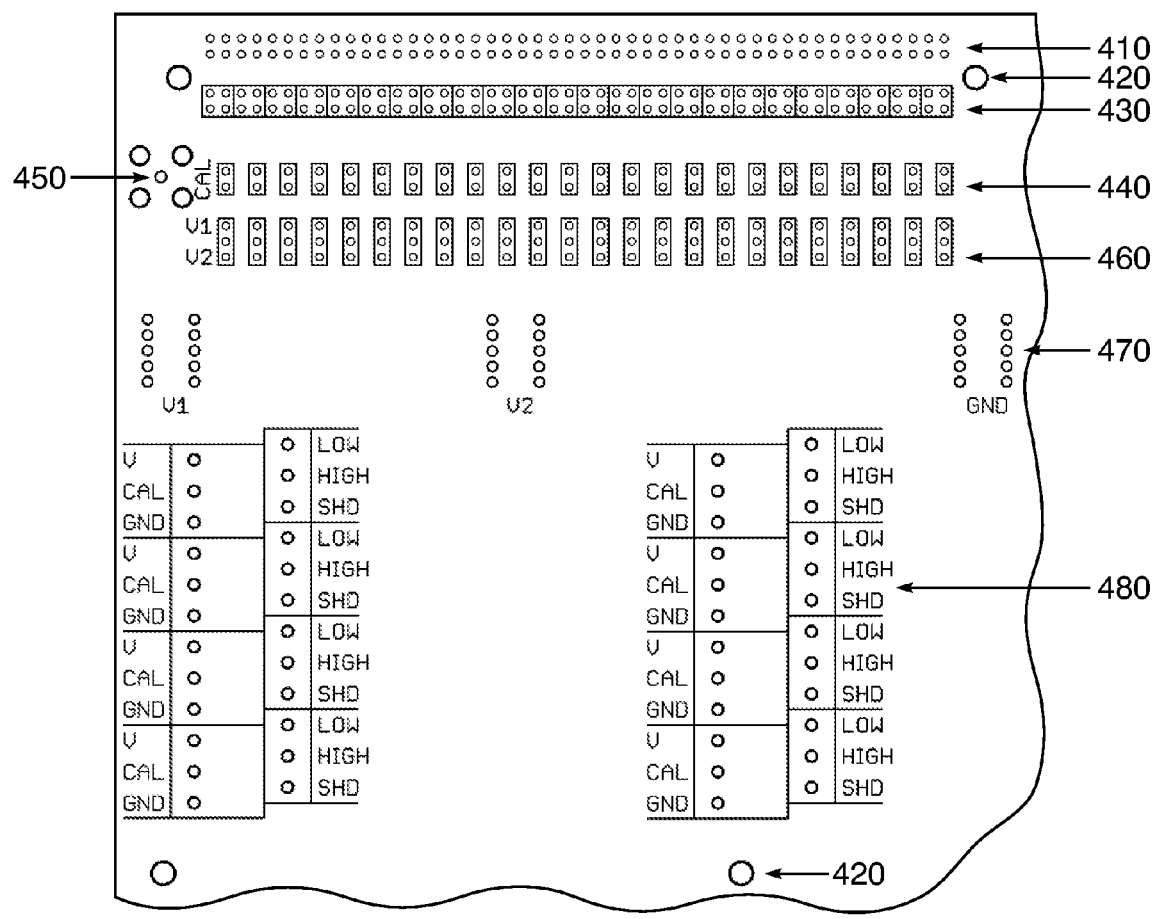
FIG. 4 is a plan view of a portion of a hydrophone input board.

Accelerometer cable 212 is joined to single-ended (SE) cable connector 230 by means of a standard single-ended (SE) cable plug (not shown). Accelerometer cable 212 can be plugged into single-ended (SE) cable connector 230 and also unplugged. As seen in FIG. 4, there may be multiple single-ended (SE) cables with a single-ended (SE) cable connector associated with each cable. For each single-ended (SE) cable there is a pair of differential signal wires carrying a signal from a transducer measuring a physical parameter such as dynamic pressure, force strain or acceleration.

Connector 236 connects higher differential signal pin contact 224c with circuit line 254 on matrix board 250. Likewise, connector 238 connects higher differential signal pin contact 222c with conductive line 252. Connector 240 connects shield pin contact 214c with common ground conductive line 270 on matrix board 250. Shield ground switches 215a and 215b on input board 210a allow shield pin contact 214c and lower differential signal pin contact 222c to be connected to the common ground conductive wire 270. This connection is made if the lower differential signal or the hydrophone shield 214s is not grounded at some other point. If the lower differential signal or the hydrophone shield 214s are otherwise grounded, lower differential switch and shield ground switch 215 are left open to prevent possible current flow.

Connections between accelerometer cable connector 212 and matrix board 250 and common ground 270 are usually provided with a terminal strip, such as a screw terminal strip to facilitate making electrical connection.

Output board 210b provides for the transfer of the pair of differential signals from matrix board 250, through single-ended cable connector 288, to single-ended (SE) output cable 296 and on to analog/digital converter 298. As seen in FIG. 2, connector 272 provides attachment of common ground 270 to output board 210b. Switch 284 is provided to connect common ground 270 to shield pin contact 290c. Switch 286 is provided to connect common ground 270 to lower differential signal pin contact 294c. Single-ended (SE) output cable 296 includes a shield 290s attached to shield pin connector 290c by way of shield wire 290. Connector 266 provides connection between circuit line 264 and higher differential signal contact pin 292c. Connector 262 provides connection between circuit line 260 and lower differential signal contact pin 294c. Contact pins 290c, 292c and 294c are all included in single-ended cable connector 288. Shield wire 290, higher differential signal wire 292 and lower differential signal wire 294 form single-ended (SE) output cable 296.

FIG. 2 shows that higher and lower differential signals from accelerometer cable 212 are transferred through matrix board 250 to single-ended (SE) cable 296 and on to analog/digital converter 298. Digital signals from converter 298 are typically recorded (not shown) for analysis. It is clear from FIG. 2 and FIG. 4 that multiple single-end (SE) cables can be assembled and connected to matrix board 250, allowing for switching of individual single-ended (SE) signals to users of the information contained therein.

FIG. 3 is a plan view of a portion of the matrix board shown schematically in FIG. 1 as matrix board 50. FIG. 3 shows the upper left quarter of the entire board. Triangular marker 305 visually identifies the orientation of the board for assembly. On the uppermost face of the matrix board is a pin connection panel. Across the top row 310 of the panel are two rows of pins for connections with jumpers to an adjoining board above (not shown). This may be another matrix board, input board, output board or input/output (I/O) board. In FIG. 1 the jumper cables are identified as continuity connectors 61 and 65. Down the left side of the panel are two rows of sockets for connection with jumpers to an adjoining board to the left (not shown). In FIG. 1 the jumper cables are identified as continuity connectors 53 and 55. Mounting holes 320 are provided for fastening the matrix board to a mounting rack (not shown).

Each channel block 330 provides four pins for attaching jumpers to make contact between an input circuit line and an output circuit line.

Two channel blocks are shown in FIG. 3A. The upper channel block is labeled 330a and the lower channel block is labeled 330b. In each channel block, the upper two pins provide attachment to two input circuit lines. The upper left pin (IN+) is a higher differential signal pin corresponding with an input circuit line. The upper right pin (IN−) is a lower differential signal pin corresponding with an input circuit line. The lower two pins provide attachment to two output circuit lines. The lower left pin (OUT+) is a higher differential signal pin corresponding with an output circuit line. The lower right pin (OUT−) is a lower differential signal pin corresponding with an output circuit line. The utility of orthogonal input and output circuit lines is apparent in maintaining an orderly array of pin contacts.

In order to complete a connection between the input circuit line and the output circuit line, two jumpers are inserted in channel block 330b. The jumpers are shown in FIG. 3A as wires connecting the two pins. Jumper 358 is placed between higher differential signal pins IN+ and OUT+. Jumper 356 is placed between lower differential signal pins IN− and OUT−. Jumper 358 corresponds with jumper 58 in FIG. 1. Jumper 356 corresponds with jumper 56 in FIG. 1.

Referring now to FIGS. 3B and 3C, a preferred jumper shown as jumper 356 is shown. Jumper 356 comprises a substantially flat thin wafer 362 of rigid, electrically insulating material, such as a phenolic resin, glass-epoxy, or the like. In this plan view jumper 356 is substantially rectangular in with a length slightly less than 0.2 inch and a width slightly less than 0.1 inch. An electrically conductive bus 364 is formed on one of the 0.2 by 0.1 inch surfaces of wafer 362. Jumper 356 is provided with a pair of holes or apertures 366 spaced 0.1 inch center-to-center and located along the longitudinal axis of the jumper equidistant from the transverse axis. Apertures 366 have diameters on the order of 0.04 inch, in order to readily accept component pin stems having a nominal cross section 0.025 inch on a side. The apertures penetrate completely through wafer 362 and bus 364.

In FIG. 3 there are 24 horizontal rows of blocks and 24 vertical rows of blocks. This provides for 24 differential signal input circuit lines and 24 differential signal output circuit lines. In FIG. 3, 576 different connections can be made. FIG. 3 is a portion of a panel having provision for 96 differential signal input circuit lines and 96 differential signal output circuit lines. In the full board that FIG. 3 is taken from, a total of 2304 connections can be made. It is immediately apparent, that with the assembly of multiple matrix boards by way of continuity connectors 310 and 315, that large numbers of circuit connections can be made.

The minimum number of circuit support layers in the matrix board is one input circuit support layer and one output circuit support layer. It is desirable to include two input circuit support layers and two output circuit support layers. The two input circuit layers are a higher differential signal layer and a lower differential signal layer. Each layer carries corresponding circuit lines. The two layers are separated by a grounded circuit layer to prevent signal leakage between the higher and lower signals. Likewise, the two output circuit layers are a higher differential signal layer and a lower differential signal layer. Each layer carries corresponding circuit lines. The two layers are separated by a ground circuit layer. In addition the pair of input circuit layers is separated from the pair of output circuit layers by a ground circuit layer. In addition, there is a ground circuit layer above and below the assembly of signal carrying layers. The ground layers provide ground circuit lines for attachment of ground pins, shield wires, grounded power lines and the like from the input board and the output board.

FIG. 4 is a plan view of a portion of the hydrophone input board shown schematically in FIG. 1 as hydrophone input board 10. FIG. 4 shows the upper left portion of the entire board. The input board provides female sockets, on the back side (not shown) for input of hydrophone sensor cables and passing signals to a matrix board. Across the top row 410 of the input board are two rows of pins for connections with jumper cables to an adjoining board. In FIG. 1 the jumper cables are identified connectors 36, 38 and 40. Across the second row 420 of the input board are mounting holes for bolting the input board to a rack (not shown). Mounting holes are repeated on the board and also labeled 420. Across the third row 430 of the input board are pins for connection to a cable shield. In each block of four pins, the two left pins are for connecting a cable shield. The two right pins are for connecting low differential signals. Across the fourth row 440 of the input board are pins for input of calibration connections.

Immediately to the left of fourth row 440 is a female BNC (bayonet Neill-Concelman) cable connector 450 for attachment of a calibration signal generator corresponding with calibration input signal contact 32 in FIG. 1.

Across the fifth row 460 of the input board is the power header with pins for power input to the hydrophone cable. Across the sixth row 470 of the input board are pins for voltage selection. This is used to carry out the function electrical power selector switch 20. The pins are labeled V1 and V2 corresponding with +24 vdc (direct current volts) and +18 vdc (direct current volts) in power supply 28. Ground pins are labeled GND. The power header 470 is available to be patched to the fifth row 460. Across the seventh row 480 are of the input board are pins for connection with the six inputs from a hydrophone cable. The six inputs are: a pair of differential signal pins (LOW and HIGH), a calibration pin (CAL), a ground pin (GND), a power pin (V) and a shield pin (SHD). The hydrophone input board portion shown in FIG. 3 has provision for the input of two hydrophone cables. The full board has provision for input of nine hydrophone cables.

Figure 5:
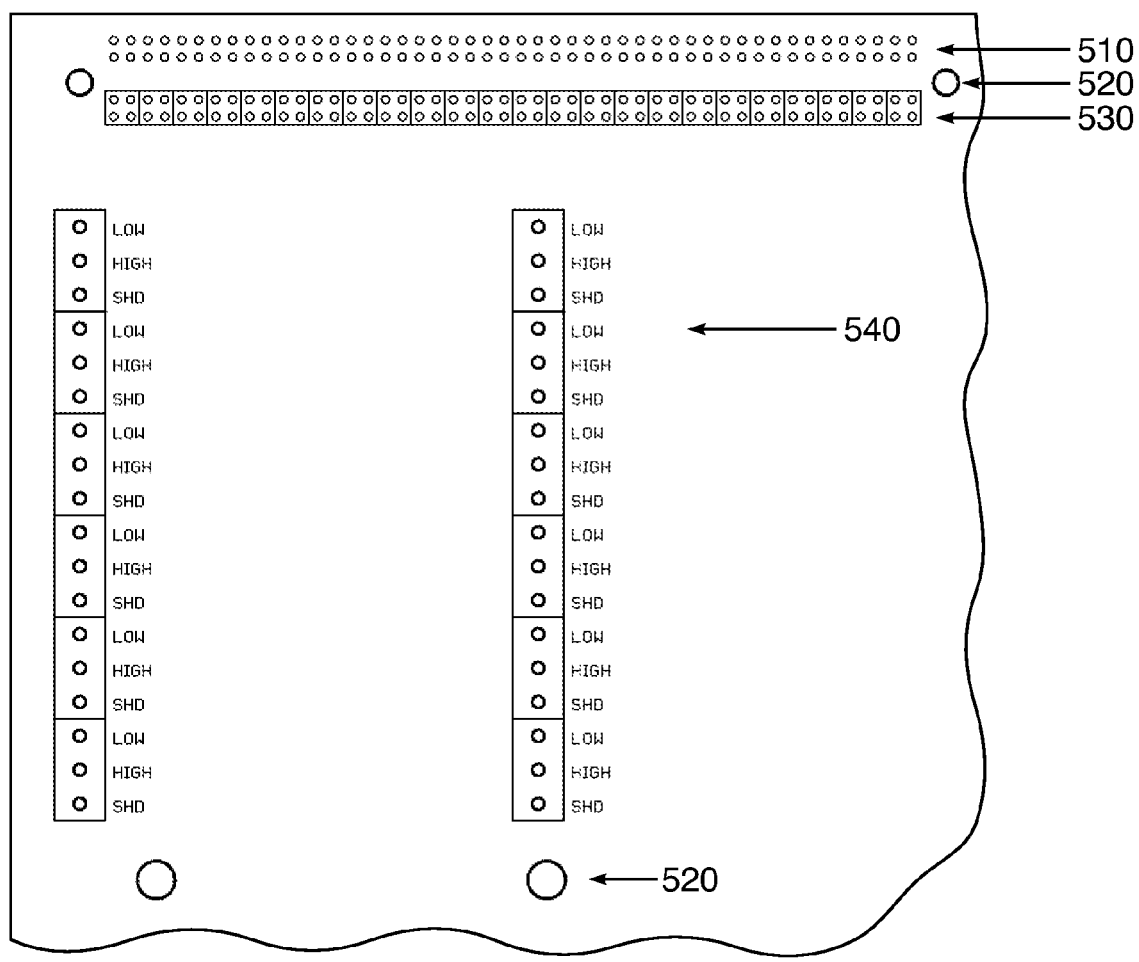
FIG. 5 is a plan view of a portion of a single-ended (SE) cable input board.

FIG. 5 is a plan view of a portion of a single-end (SE) cable input board shown schematically in FIG. 2 as input board 210a. On the back of the input board are female sockets for input of single-ended (SE) sensor cables. The input board provides for passing signals to a matrix board. Across the top row 510 of the input board are two rows of pins for connections with an adjoining board. In FIG. 2 the jumper cables are identified as connectors 236, 238 and 240. Across the second row 520 of the input board are mounting holes for bolting the input board to a rack (not shown). Mounting holes are repeated on the board and also labeled 520. Across the third row 530 of the input board are blocks of four pins. In each block of four pins, the two left pins are for connection to the cable shield. The two right pins are for connecting differential signals. Across the fourth row 540 of the input board are pins for connection to three inputs from a single-ended (SE) cable. The three inputs are: a pair of differential signals (LOW and HIGH) and a shield (SHD). The single-ended (SE) input board portion shown in FIG. 4 has provision for the input of two single-ended (SE) cables. The full board has provision for input of eight single-ended (SE) cables.

Figure 6:
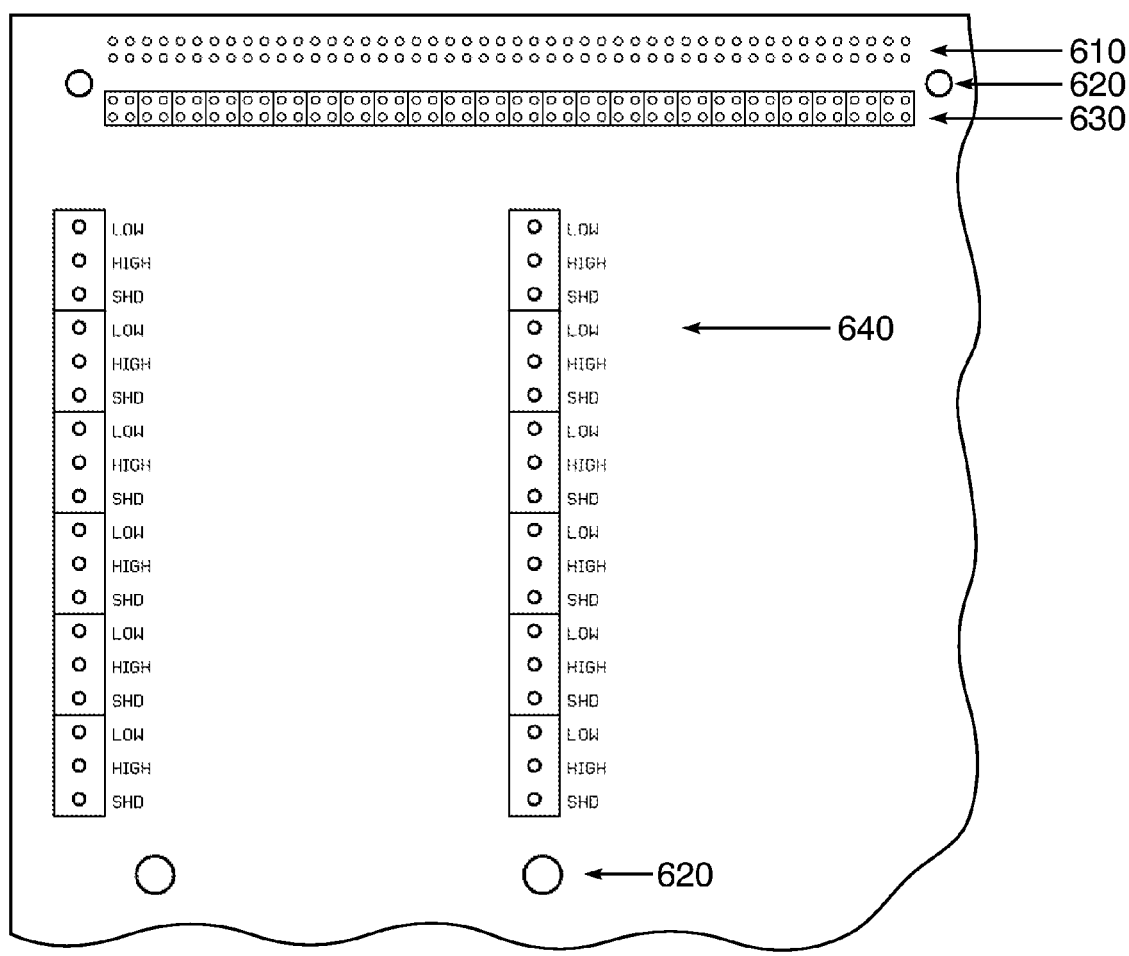
FIG. 6 is a plan view of a portion of an output board.

FIG. 6 is a plan view of a portion of the cable output board shown schematically in FIG. 1 as output board 80 and in FIG. 2 as output board 210a. The output board provides female sockets for output of single-ended (SE) sensor cables and passing signals to an analog to digital converter 95. Across the top row 610 of the output board are two rows of female sockets for attachment of jumper cables for continuity with an adjoining board. In FIG. 1 jumper cables correspond with continuity connectors 62, 66, and 72. Across the second row 620 of the input board are mounting holes for bolting the input board to a rack (not shown). Mounting holes of another diameter are repeated on the board and also labeled 620. Across the third row 630 of the output board are blocks of four female sockets. The left two are for cable shield connectors. The right two are for connecting differential low signal connectors. Across the fourth row 640 of the output board are female sockets for output of three inputs from a single-ended (SE) cable. The three outputs are: a pair of differential signal wires and a shield wire. The single-ended (SE) output board shown in FIG. 5 has provision for the output of two single-ended (SE) cables. The full board has provision for output of eight single-ended (SE) cables.

The similarity of the input board shown in FIG. 5 and the output board in FIG. 6 is apparent. The distinguishing feature of the input board and the output board is in the connections made to and from them and not in the board itself. A single board can serve as both an input board and an output board; that is an input/output (I/O) board. This is accomplished by careful labeling inputs and outputs on the board. For example, the output board shown in FIG. 6 can be reconfigured to receive input of four single-ended (SE) cables and output of four single-ended (SE) cables.

Not shown, on the back of boards, is a terminal strip connector, such as a screw terminal strip connector. This facilitates attaching the cable wires to the contacts on the board.

The foregoing discussion discloses and describes embodiments of the invention by way of example. One skilled in the art will readily recognize from this discussion, that various changes, modifications and variations can be made therein without departing from the spirit and scope of the invention as defined in the following claims.

What is claimed is:

1. An assembly of connected circuit boards, the circuit boards including at least one each of a matrix board, an input board and an output board:
   (a.) the matrix board comprising:
      (i.) a pin connection panel, and
      (ii.) superposed circuit support layers, including at least one input circuit support layer with input circuit lines on one face thereof and at least one output circuit support layer with output circuit lines on one face thereof, multiple conductive pins attached to each circuit line, the conductive pins extending to the panel and arranged in a patterned array, wherein in the patterned array a pin associated with each input circuit line is paired with and directly adjacent a pin associated with each output circuit line and connectable thereto;
   (b.) the input board comprises:
      at least one differential signal sensor cable connector having pin contacts, including differential signal pin contacts corresponding with differential signal carrying lines in the differential signal sensor cable, and a connector between each differential signal pin contact and an input circuit line on an input circuit support layer of the matrix board; and
   (c.) the output board comprises:
      a cable connector having pin contacts connected with circuit lines on the output circuit support layer on the matrix board.

2. The assembly of claim 1 wherein the matrix board includes continuity connectors connecting the circuit lines with corresponding circuit lines on any adjoining matrix board.

3. The assembly of claim 1 wherein in the matrix board, the circuit lines on the output circuit support layer are orthogonal to the circuit lines on the input circuit support layer.

4. The assembly of claim 1 wherein the input board and the output board are jointed to form an input/output board.

5. The assembly of claim 1 wherein the matrix board has a circuit support layer on which all circuit lines are grounded and at least one grounded circuit line thereon is connected to a pin contact on each of the input board and the output board.

6. An assembly of connected circuit boards, the circuit boards including at least one each of a matrix board, an input board and an output board:
   (a.) the matrix board comprising:
      (i.) a pin connection panel, and
      (ii.) superposed circuit support layers include at least one input circuit support layer and at least one output circuit support layer, each circuit support layer having corresponding circuit lines on one face thereof, multiple conductive pins attached to each circuit line, the conductive pins extending to the panel and arranged in a patterned array, wherein in the array a pin associated with each input circuit line is paired with and directly adjacent a pin associated with each output circuit line and connectable thereto;
   (b.) the input board comprising:
      (i.) at least one hydrophone sensor cable connector having pin contacts, including differential signal pin contacts corresponding with high differential signal carrying lines in the hydrophone sensor cable, and a connector between each high differential signal pin contact and a circuit line on the input circuit support layer of the matrix board, and
      (ii.) at least one single-ended (SE) signaling cable connector having pin contacts, including a differential signal pin contacts corresponding with low differential signal carrying lines in the single-ended (SE) cable, and a connector between each low differential signal pin contact and a circuit line on the input circuit support layer of the matrix board; and
   (c.) the output board comprises:
   a cable connector having pin contacts connected with circuit lines on the output circuit support layer of the matrix board.

7. The assembly of claim 6 wherein the matrix board includes continuity connectors connecting the circuit lines with corresponding circuit lines on any adjoining matrix board.

8. The assembly of claim 6 wherein the input board and the output board are jointed to form an input/output board.

9. The assembly of claim 6 wherein the matrix board, paired pins are separated by about 0.1 inch.

10. The assembly of claim 6 wherein in the input board, in the hydrophone sensor cable connector a shield pin contact corresponds with a hydrophone sensor cable shield, and the shield pin is connected to a grounded circuit line on the matrix board.

11. The assembly of claim 6 wherein in the input board, in the hydrophone sensor cable connector, power pin contacts are connected to power providing lines in the hydrophone sensor cable, and a ground pin is connected to a grounded circuit line on the matrix board.

12. The assembly of claim 6 wherein in the input board, in the hydrophone sensor cable connector, a calibration pin contact is connected to a calibration line in the hydrophone sensor cable, and is connectable to a calibration signal providing means.

13. The assembly of claim 6 wherein in the input board, in the single-ended (SE) cable connector, a pin contact corresponds with a shield in the single-ended (SE) cable, and is connected to a grounded circuit line on the matrix board.

14. The assembly of claim 6 wherein the matrix board has a circuit support layer on which all circuit support lines are grounded and at least one grounded circuit support line thereon is connected to a pin contact on each of the input board and the output board.

15. The assembly of claim 6 wherein the output board pin contacts in contact with circuit lines on the output circuit support layer connect with a single-ended (SE) signaling cable connector.

16. The assembly of claim 6 wherein in the input board and in the output board, the connectors are assembled in a terminal strip.

17. The assembly of claim 6 wherein the single-ended (SE) signaling cable is an accelerometer cable having signal wire, a ground wire and a shield.

18. The assembly of claim 6 wherein in the matrix board, on the input support layer, there are 48 to 144 pairs of circuit lines.

19. The assembly of claim 6 wherein the matrix board comprises four input circuit support layers including:
   two high differential signal input circuit support layers including: a higher high differential signal support layer and a lower high differential signal support layer, each high differential signal support layer having corresponding input circuit lines on one face thereof, and
   two low differential signal input circuit support layers including: a higher low differential signal support layer and a lower low differential signal support layer, each low differential input circuit support layer having corresponding input circuit lines on one face thereof.

20. The assembly of claim 6 wherein the matrix board comprises four input circuit support layers including:
   two high differential signal input circuit support layers including: a higher high differential signal support layer and a lower high differential signal support layer, each high differential signal support layer having corresponding input circuit lines on one face thereof, and
   two low differential signal input circuit support layers including: a higher low differential signal support layer and a lower low differential signal support layer, each low differential signal input circuit support layer having corresponding input circuit lines on one face thereof, and grounded circuit support layers separating the four input circuit support layers.

* * * * *